(12) United States Patent
Matsumoto et al.

(10) Patent No.: US 11,702,569 B2
(45) Date of Patent: Jul. 18, 2023

(54) SLURRY AND POLISHING METHOD

(71) Applicant: HITACHI CHEMICAL COMPANY, LTD., Tokyo (JP)

(72) Inventors: Takaaki Matsumoto, Tokyo (JP);
Tomohiro Iwano, Tokyo (JP);
Tomoyasu Hasegawa, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 16/642,120

(22) PCT Filed: Aug. 30, 2018

(86) PCT No.: PCT/JP2018/032133
§ 371 (c)(1),
(2) Date: Feb. 26, 2020

(87) PCT Pub. No.: WO2019/044978
PCT Pub. Date: Mar. 7, 2019

(65) Prior Publication Data
US 2020/0299545 A1    Sep. 24, 2020

(30) Foreign Application Priority Data

Aug. 30, 2017 (WO) .................. PCT/JP2017/031087

(51) Int. Cl.
*C09G 1/02* (2006.01)
*C09K 3/14* (2006.01)
*H01L 21/3105* (2006.01)

(52) U.S. Cl.
CPC .............. *C09G 1/02* (2013.01); *C09K 3/1436* (2013.01); *H01L 21/31053* (2013.01)

(58) Field of Classification Search
CPC .................................. C09G 1/02; C09G 1/00
See application file for complete search history.

(56) References Cited

U.S. PATENT DOCUMENTS 5,759,917 A * 6/1998 Grover ................. C09K 3/1463
438/690
2004/0089634 A1* 5/2004 Grover ................. C09K 3/1463
216/89
(Continued)

FOREIGN PATENT DOCUMENTS

CN    1384170 A    12/2002
CN    1475540 A     2/2004
(Continued)

OTHER PUBLICATIONS

"Cerium Hydroxide", Web Page, No date.*
(Continued)

*Primary Examiner* — Thomas T Pham
(74) *Attorney, Agent, or Firm* — Fitch, Even, Tabin & Flannery, L.L.P.

(57) ABSTRACT

A slurry containing abrasive grains, a liquid medium, and a salt of a compound represented by formula (1) below, in which the abrasive grains include first particles and second particles in contact with the first particles, the first particles contain cerium oxide, and the second particles contain a hydroxide of a tetravalent metal element.

[Chemical Formula 1]

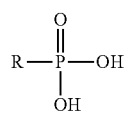

(1)

[In formula (1), R represents a hydroxyl group or a monovalent organic group].

18 Claims, 1 Drawing Sheet

(56) References Cited

U.S. PATENT DOCUMENTS

| | | | | |
|---|---|---|---|---|
| 2006/0032149 | A1* | 2/2006 | Kim | C09K 3/1463 |
| | | | | 51/307 |
| 2006/0048455 | A1* | 3/2006 | Hirano | B24B 37/044 |
| | | | | 51/308 |
| 2008/0254628 | A1* | 10/2008 | Boggs | H01L 21/3212 |
| | | | | 438/693 |
| 2010/0056026 | A1* | 3/2010 | Shirota | H01L 21/31053 |
| | | | | 451/41 |
| 2012/0299158 | A1* | 11/2012 | Shinoda | H01L 21/31053 |
| | | | | 257/618 |
| 2014/0051250 | A1* | 2/2014 | Minami | B24B 37/044 |
| | | | | 438/693 |
| 2014/0349483 | A1* | 11/2014 | Li | H01L 21/31053 |
| | | | | 438/693 |
| 2016/0221146 | A1* | 8/2016 | Lugg | B24B 37/26 |
| 2016/0237316 | A1* | 8/2016 | Suzuki | C09G 1/02 |
| 2016/0272860 | A1* | 9/2016 | Mizoguchi | C01F 17/229 |
| 2020/0157382 | A1* | 5/2020 | Park | C09G 1/02 |
| 2020/0299544 | A1* | 9/2020 | Hanano | H01L 21/31053 |

FOREIGN PATENT DOCUMENTS

| | | |
|---|---|---|
| CN | 103740329 A | 4/2014 |
| JP | H8-022970 A | 1/1996 |
| JP | H10-106994 A | 4/1998 |
| JP | 2006-249129 A | 9/2006 |
| JP | 2009-290188 A | 12/2009 |
| JP | 2010-141288 A | 6/2010 |
| JP | 2013-141041 A | 7/2013 |
| KR | 2000-0069823 A | 11/2000 |
| KR | 10-2012-0024810 A | 3/2012 |
| TW | 201129686 A | 9/2011 |
| WO | 02/067309 A1 | 8/2002 |
| WO | 2011/071168 A1 | 6/2011 |
| WO | 2012/070541 A1 | 5/2012 |
| WO | 2012/070542 A1 | 5/2012 |
| WO | 2012/070544 A1 | 5/2012 |

OTHER PUBLICATIONS

Song Xiaolan et al., "Dispersion Behaviors of CeO2 Nanoparticles in Water Suspension", Chinese Journal of Rare Petals, vol. 29, No. 2, Apr. 2005, pp. 167-172 (English language abstract on last page) (Cited in Office Action dated Jan. 19, 2021 in Counterpart Chinese Application No. 201880055358.0).

* cited by examiner

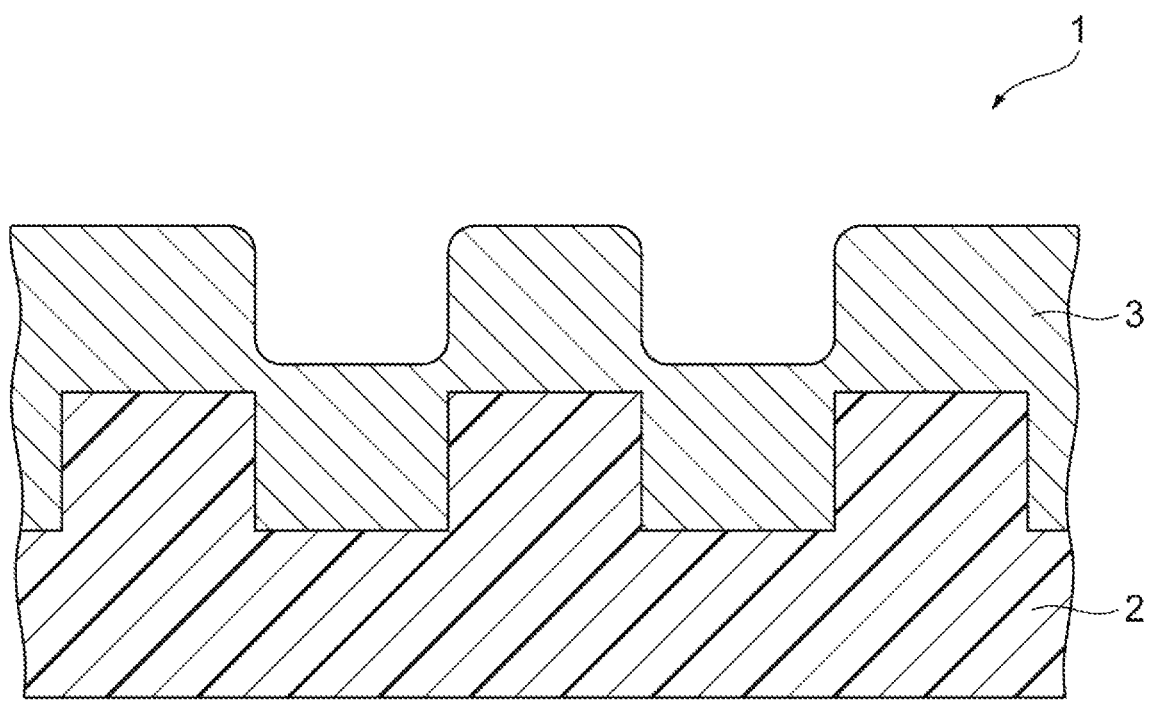

SLURRY AND POLISHING METHOD

CROSS-REFERENCE TO RELATED APPLICATIONS

This application is a U.S. national phase application filed under 35 U.S.C. § 371 of International Application No. PCT/JP2018/032133, filed Aug. 30, 2018, designating the United States, which claims priority from International Application No. PCT/JP2017/031087, filed Aug. 30, 2017, designating the United States, which are hereby incorporated herein by reference in their entirety.

TECHNICAL FIELD

The present invention relates to a slurry and a polishing method.

BACKGROUND ART

In the manufacturing steps for semiconductor elements of recent years, the importance of processing technologies for density increase and micronization is increasing more and more. CMP (Chemical mechanical polishing) technology, which is one of the processing technologies, has become an essential technology for the formation of a shallow trench isolation (hereinafter, referred to as "STI"), flattening of an interlayer portion composed of a pre-metal insulating material or an interlayer insulating material, formation of a plug or an embedded metal wiring, or the like in the manufacturing steps for semiconductor elements.

Regarding polishing liquids that are most commonly used, for example, silica-based polishing liquids containing silica (silicon oxide) particles such as fumed silica or colloidal silica as abrasive grains are mentioned. Silica-based polishing liquids have a feature of high flexibility of use, and by appropriately selecting the content of abrasive grains, pH, additives, or the like, polishing of a wide variety of materials can be achieved regardless of whether the material is an insulating material or an electroconductive material.

On the other hand, there is also an increasing demand for polishing liquids containing cerium compound particles as abrasive grains, as polishing liquids mainly intended for insulating materials such as silicon oxide. For example, cerium oxide-based polishing liquids containing cerium oxide (ceria) particles as abrasive grains can polish silicon oxide at high rate with even lower contents of abrasive grains than silica-based polishing liquids (see, for example, Patent Literatures 1 and 2 below).

Incidentally, in recent years, in the manufacturing steps for semiconductor elements, it is required to achieve further micronization of wiring, and polishing scratches generated during polishing are becoming problematic. That is, when polishing is performed using a conventional cerium oxide-based polishing liquid, even if minute polishing scratches are generated, there has been no problem as long as the sizes of these polishing scratches are smaller than conventional wiring widths; however, in a case in which it is directed to achieve further micronization of the wiring, even minute polishing scratches become problematic.

With regard to this problem, an investigation has been conducted on polishing liquids that use particles of a hydroxide of a tetravalent metal element (see, for example, Patent Literatures 3 to 5 below). Furthermore, methods for producing particles of a hydroxide of a tetravalent metal element have also been investigated (see, for example, Patent Literatures 6 and 7 below). These technologies are directed to reduce polishing scratches caused by particles, by making the mechanical action as small as possible while utilizing the chemical action of particles of a hydroxide of a tetravalent metal element.

CITATION LIST

Patent Literature

Patent Literature 1: Japanese Unexamined Patent Publication No. H10-106994

Patent Literature 2: Japanese Unexamined Patent Publication No. H08-022970

Patent Literature 3: International Publication WO 2002/067309

Patent Literature 4: International Publication WO 2012/070541

Patent Literature 5: International Publication WO 2012/070542

Patent Literature 6: Japanese Unexamined Patent Publication No. 2006-249129

Patent Literature 7: International Publication WO 2012/070544

SUMMARY OF INVENTION

Technical Problem

Incidentally, in recent years, 3D-NAND devices in which the cell portions of a device are laminated in the longitudinal direction have come to the fore. In this technology, the level differences of the insulating portions during cell formation are several times higher compared to the conventional planar types. According to this, in order to maintain the throughput of the device production, a technology for rapidly resolving the above-described high level differences in a CMP step or the like is required.

The present inventors have found that, by using a slurry which contains first particles containing cerium oxide and second particles containing a hydroxide of a tetravalent metal element, a polishing rate for an insulating material constituting the insulating portion can be improved, but the aggregation of the abrasive grains occurs in the slurry so that polishing characteristics may deteriorate.

The present invention was made in order to solve the above-described problems, and an object thereof is to provide a slurry in which an increase in particle size of the abrasive grains caused by aggregation hardly occurs, and a polishing method using the slurry.

Solution to Problem

An aspect of the present invention relates to a slurry containing abrasive grains, a liquid medium, and a salt of a compound represented by formula (1) below, in which the abrasive grains include first particles and second particles in contact with the first particles, the first particles contain cerium oxide, and the second particles contain a hydroxide of a tetravalent metal element.

[Chemical Formula 1]

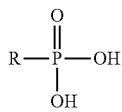

[In formula (1), R represents a hydroxyl group or a monovalent organic group.]

In this slurry, the aggregation of the abrasive grains and an increase in particle size of the abrasive grains caused by this aggregation hardly occur. That is, this slurry is excellent in storage stability. Since a change in polishing characteristics (for example, polishing rate) is small in this slurry even after long-term storage, according to this slurry, polishing can be stably performed. Furthermore, according to this slurry, there is a tendency that the polishing rate for the insulating material can be improved and the insulating material can be polished with a high polishing rate. Furthermore, according to this slurry, there is a tendency that, in the CMP technology of flattening insulating portions composed of an STI insulating material, a pre-metal insulating material, an interlayer insulating material, or the like, a high degree of flattening of these insulating portions can be achieved.

Incidentally, generally, as the content of abrasive grains is increased, polishing scratches tend to be generated easily. On the other hand, according to the slurry of the present embodiment, a sufficient polishing rate is easily obtainable even with a small amount of the abrasive grains. Therefore, there is a tendency that, by using a small amount of the abrasive grains, an insulating material can be polished with fewer polishing scratches while achieving a sufficient polishing rate.

The hydroxide of a tetravalent metal element may contain at least one selected from the group consisting of hydroxides of rare earth metal elements and hydroxide of zirconium.

A content of the abrasive grains may be 0.01 to 10% by mass on the basis of the total mass of the slurry.

The salt of the compound represented by formula (1) may contain an ammonium salt. The salt of the compound represented by formula (1) may contain a salt of a compound in which the R is a hydroxyl group. The salt of the compound represented by formula (1) may contain a salt of a compound represented by formula (1a) below.

[Chemical Formula 2]

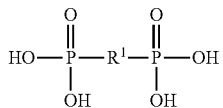

[In formula (1a), IV represents a divalent organic group.]

A content of the salt of the compound represented by formula (1) may be 0.001 to 0.1% by mass on the basis of the total mass of the slurry.

Another aspect of the present invention relates to use of the above-described slurry in polishing of a body to be polished containing silicon oxide. The above-described slurry can improve a polishing rate for silicon oxide, and thus is suitably used for polishing a surface to be polished containing silicon oxide.

Still another aspect of the present invention relates to a polishing method including a step of polishing a body to be polished by using the above-described slurry. According to this polishing method, it is possible to polish an insulating material with a high polishing rate and obtain a high polishing rate even after long-term storage of the slurry. Furthermore, according to this polishing method, in the CMP technology of flattening insulating portions composed of an STI insulating material, a pre-metal insulating material, an interlayer insulating material, or the like, a high degree of flattening of these insulating portions can be achieved.

Advantageous Effects of Invention

According to the present invention, it is possible to provide a slurry in which an increase in particle size of the abrasive grains caused by aggregation hardly occurs, and a polishing method using the slurry. According to the present invention, it is possible to provide use of the slurry in a flattening step of a base substrate surface that is the manufacturing technology of semiconductor elements. Furthermore, according to the present invention, it is possible to provide use of the slurry in a flattening step of an insulating portion composed of an STI insulating material, a pre-metal insulating material, or an interlayer insulating material.

BRIEF DESCRIPTION OF DRAWINGS

FIG. 1 is a schematic cross-sectional view illustrating a base substrate used in a polishing method of an embodiment.

DESCRIPTION OF EMBODIMENTS

In the following description, a slurry of embodiments of the present invention, and a polishing method using the slurry will be described in detail.

<Definition>

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. Also, the upper limit value and the lower limit value can be arbitrarily combined. In the numerical ranges that are described in the present specification, the upper limit value or the lower limit value of the numerical value range may be replaced with the value shown in the examples. Materials listed as examples in the present specification can be used singly or in combinations of two or more, unless otherwise specifically indicated. In the present specification, when a plurality of substances corresponding to each component exist in the composition, the content of each component in the composition means the total amount of the plurality of substances that exist in the composition, unless otherwise specified. In the present specification, "polishing rate for material A" means a removal rate for a substance composed of the material A by polishing. The term "step" includes not only an independent step but also a step by which an intended action of the step is achieved, even though the step cannot be clearly distinguished from other steps.

<Slurry>

The slurry of the present embodiment contains abrasive grains, a liquid medium, and a salt of a compound represented by formula (1) below. The slurry of the present embodiment can be used as a polishing liquid (for example, a polishing liquid for CMP (hereinafter, referred to as "CMP polishing liquid")). Specifically, the slurry (polishing liquid) of the present embodiment can be suitably used in polishing of a body to be polished containing an insulating material and can be suitably used particularly in polishing of a body to be polished containing silicon oxide (such as silicon dioxide ($SiO_2$) or carbon-containing silicon oxide (SiOC)). Incidentally, in the present specification, the "polishing liquid" (abrasive) is defined as a composition to be brought into contact with a surface to be polished, at the time of polishing. The term "polishing liquid" itself does not limit any components contained in the polishing liquid. Hereinafter, essential components and optional components will be described.

[Chemical Formula 3]

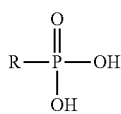

(1)

[In formula (1), R represents a hydroxyl group or a monovalent organic group.]

(Abrasive Grains)

The abrasive grains include first particles containing cerium oxide and second particles containing a hydroxide of a tetravalent metal element. In the slurry, at least a part of the first particles and the second particles exists as composite particles including the first particles and the second particles in contact with the first particles (for example, composite particles composed of the first particles and the second particles). Incidentally, in the present specification, the "abrasive grains" mean particles or aggregates thereof contained in the slurry, and are also referred to as "abrasive particles." The abrasive grains are generally solid particles. In polishing using the abrasive grains, it is considered that an object to be removed is removed by the mechanical action of the abrasive grains and the chemical action of the abrasive grains (mainly, the surface of the abrasive grains), but the polishing mechanism due to the abrasive grains is not limited thereto.

According to the slurry of the present embodiment, there is a tendency that the polishing rate for the insulating material can be improved. The reason for this is speculated that at least the above-described abrasive grains are used. That is, the first particles (particles containing cerium oxide) have strong physical action (mechanical performance, mechanical action) on an insulating material. On the other hand, the second particles (particles containing a hydroxide of a tetravalent metal element) have high reactivity with an insulating material based on chemical action (chemical performance). For example, hydroxyl groups act to obtain high reactivity between the second particles and an insulating material. Furthermore, in a case in which the force of electrostatically attracting an insulating material (for example, silicon oxide) is strong, high reactivity between the second particles and the insulating material is easily obtainable. Therefore, it is speculated that the polishing rate for an insulating material is improved by a synergistic effect obtainable by using the first particles having strong physical action and the second particles having strong chemical action.

Examples of the cerium oxide include $CeO_x$ (x=1.5 to 2.0) and specific examples thereof include $CeO_2$ (ceria) and $Ce_2O_3$.

The hydroxide of a tetravalent metal element is a compound containing a tetravalent metal ($M^{4+}$) and at least one hydroxide ion ($OH^-$). The hydroxide of a tetravalent metal element may also contain an anion other than hydroxide ion (for example, nitrate ion $NO_3^-$ and sulfate ion $SO_4^{2-}$). For example, the hydroxide of a tetravalent metal element may also contain an anion (for example, nitrate ion $NO_3^-$ and sulfate ion $SO_4^{2-}$) bonded to a tetravalent metal element.

Compared to abrasive grains composed of silica, ceria, or the like, the abrasive grains containing a hydroxide of a tetravalent metal element have high reactivity with an insulating material (for example, silicon oxide) and contribute to the improvement in the polishing rate for an insulating material.

From the viewpoint that the polishing rate for an insulating material further improves, it is preferable that the hydroxide of a tetravalent metal element contains at least one selected from the group consisting of hydroxides of rare earth metal elements and hydroxide of zirconium. From the viewpoint that the polishing rate for an insulating material further improves, it is more preferable that the hydroxide of a tetravalent metal element is a hydroxide of a rare earth metal element. Examples of the rare earth metal element that can adopt tetravalence include lanthanoids such as cerium, praseodymium, or terbium, and among these, from the viewpoint that a polishing rate for an insulating material is further excellent, a lanthanoid is preferred and cerium is more preferred. A hydroxide of a rare earth metal element and hydroxide of zirconium may be used in combination, or two or more kinds from hydroxides of rare earth metal elements can be selected and used.

The abrasive grains can be used singly or in combination of two or more kinds thereof. The slurry of the present embodiment may contain particles other than the composite particles including the first particles and the second particles. Examples of such other particles include the first particles not in contact with the second particles (the second particles not in contact with the first particles) and particles not containing cerium oxide and a hydroxide of a tetravalent metal element (for example, particles composed of silica, alumina, zirconia, yttria, or the like).

The particle size of the first particles in the slurry is preferably 15 nm or more, more preferably 25 nm or more, even more preferably 35 nm or more, and particularly preferably 40 nm or more, from the viewpoint of further improving the polishing rate for the insulating material. The particle size of the first particles is preferably 1000 nm or less, more preferably 800 nm or less, even more preferably 600 nm or less, and particularly preferably 500 nm or less, from the viewpoint of improving the dispersibility of the abrasive grains and the viewpoint of further suppressing scratches at the polished surface. From these viewpoints, the particle size of the first particles is preferably 15 to 1000 nm, more preferably 25 to 800 nm, even more preferably 35 to 600 nm, and particularly preferably 40 to 500 nm. The average particle size (average secondary particle size) of the first particles is preferably in the above ranges.

The particle size of the second particles in the slurry is preferably 1 nm or more, more preferably 2 nm or more, even more preferably 3 nm or more, from the viewpoint of further improving the polishing rate for the insulating material. The particle size of the second particles is preferably 25 nm or less, more preferably 20 nm or less, and even more preferably 15 nm or less, from the viewpoint of improving the dispersibility of the abrasive grains and the viewpoint of further suppressing scratches at the polished surface. From these viewpoints, the particle size of the second particles is preferably 1 to 25 nm, more preferably 2 to 20 nm, and even more preferably 3 to 15 nm. The average particle size (average secondary particle size) of the second particles is preferably in the above ranges.

The particle size (for example, average particle size) of the second particles is preferably smaller than the particle size (for example, average particle size) of the first particles, from the viewpoint of further improving the polishing rate for the insulating material. In general, particles having a small particle size have a larger surface area per unit mass than that of particles having a large particle size, and thus have higher reaction activity. On the other hand, the mechanical action (mechanical polishing force) of particles having a small particle size is smaller than that of particles having a large particle size. Therefore, it is speculated that, in a case in which the particle size of the second particles is smaller than the particle size of the first particles, the reaction activity of the second particles with respect to the insulating material is further increased and the chemical action becomes stronger, while the mechanical polishing action of the first particles becomes stronger. As a result, it is speculated that the synergistic effect by using the first particles and the second particles in combination can be further increased, and thus the polishing rate for the insulating material can be further improved.

The average particle size (average secondary particle size) of the abrasive grains (the whole abrasive grains containing composite particles) in the slurry is preferably 20 nm or more, more preferably 30 nm or more, even more preferably 40 nm or more, particularly preferably 50 nm or more, extremely preferably 100 nm or more, highly preferably 120 nm or more, still even more preferably 150 nm or more, especially preferably 200 nm or more, and most preferably 300 nm or more, from the viewpoint of further improving the polishing rate for the insulating material. The average particle size of the abrasive grains is preferably 1000 nm or less, more preferably 800 nm or less, even more preferably 600 nm or less, particularly preferably 500 nm or less, and extremely preferably 400 nm or less, from the viewpoint of improving the dispersibility of the abrasive grains and the viewpoint of further suppressing scratches at the polished surface. From these viewpoints, the average particle size of the abrasive grains is preferably 20 to 1000 nm, more preferably 30 to 800 nm, even more preferably 40 to 600 nm, particularly preferably 50 to 500 nm, extremely preferably 100 to 400 nm, highly preferably 120 to 400 nm, still even more preferably 150 to 400 nm, especially preferably 200 to 400 nm, and most preferably 300 to 400 nm.

The average particle size (average secondary particle size) is measured using an optical diffraction scattering type particle size distribution meter (for example, trade name: N5 manufactured by Beckman Coulter, Inc. or trade name: MICROTRAC MT3300EXII manufactured by Microtrac-BEL Corp.).

The D99 particle size of the abrasive grains in the slurry is preferably 150 nm or more, more preferably 200 nm or more, and even more preferably 250 nm or more, from the viewpoint of further improving the polishing rate for the insulating material. The D99 particle size of the abrasive grains in the slurry is preferably 2000 nm or less, more preferably 1500 nm or less, and even more preferably 1200 nm or less, from the viewpoint of improving the dispersibility of the abrasive grains and the viewpoint of further suppressing scratches at the polished surface. From these viewpoints, the D99 particle size of the abrasive grains in the slurry is preferably 150 to 2000 nm, more preferably 200 to 1500 nm, and even more preferably 250 to 1200 nm. The D99 particle size is measured using an optical diffraction scattering type particle size distribution meter (trade name: MICROTRAC MT3300EXII manufactured by Microtrac-BEL Corp.).

The first particles in the slurry preferably have a negative zeta potential from the viewpoints of causing the first particles and the second particles to appropriately act and further improving the polishing rate for the insulating material. The zeta potential of the first particles in the slurry is preferably −20 mV or less, more preferably −25 mV or less, even more preferably −30 mV or less, and particularly preferably −35 mV or less, from the viewpoint of further improving the polishing rate for the insulating material. The lower limit of the zeta potential of the first particles is not particularly limited. The zeta potential of the first particles may be, for example, −200 mV or more. That is, the zeta potential of the first particles may be −200 to −20 mV, −200 to −25 mV, −200 to −30 mV, or −200 to −35 mV.

The second particles in the slurry preferably have a positive zeta potential from the viewpoints of causing the second particles and the first particles to appropriately act and further improving the polishing rate for the insulating material. The zeta potential of the second particles in the slurry is preferably +10 mV or more, more preferably +15 mV or more, even more preferably +20 mV or more, and particularly preferably +25 mV or more, from the viewpoint of further improving the polishing rate for the insulating material. The upper limit of the zeta potential of the second particles is not particularly limited. The zeta potential of the second particles may be, for example, +200 mV or less. That is, the zeta potential of the second particles may be +10 to +200 mV, +15 to +200 mV, +20 to +200 mV, or +25 to +200 mV.

The zeta potential (the zeta potential of the whole abrasive grains) of the abrasive grains (abrasive grains containing composite particles) in the slurry is preferably +10 mV or more, more preferably +20 mV or more, even more preferably +25 mV or more, particularly preferably +30 mV or more, extremely preferably +40 mV or more, and highly preferably +50 mV or more, from the viewpoint of further improving the polishing rate for the insulating material. The upper limit of the zeta potential of the abrasive grains is not particularly limited. The zeta potential of the abrasive grains may be, for example, +200 mV or less. That is, the zeta potential of the abrasive grains may be +10 to +200 mV, +20 to +200 mV, +25 to +200 mV, +30 to +200 mV, +40 to +200 mV, or +50 to +200 mV.

The zeta potential is a surface potential of the particle. The zeta potential can be measured, for example, using a dynamic light scattering type zeta potential measuring apparatus (for example, trade name: DelsaNano C manufactured by Beckman Coulter, Inc.). The zeta potential of the particles can be adjusted using an additive. For example, by bringing monocarboxylic acid (for example, acetic acid) into contact with particles containing cerium oxide, particles having a positive zeta potential can be obtained. Furthermore, by bringing a material having a carboxyl group (polyacrylic acid or the like) into contact with particles containing cerium oxide, particles having a negative zeta potential can be obtained.

The composite particles including the first particles and the second particles can be obtained, for example, by bringing the first particles and the second particles into contact with each other using a homogenizer, a nanomizer, a ball mill, a bead mill, a sonicator, or the like, by bringing the first particles and the second particles each having opposing charges to each other into contact with each other, by bringing the first particles and the second particles into contact with each other in a state of a small content of the particles, or the like.

The content of the cerium oxide (for example, ceria) in the abrasive grains is preferably 50% by mass or more, more preferably 60% by mass or more, even more preferably 70% by mass or more, and particularly preferably 80% by mass or more, on the basis of the whole abrasive grains (the whole abrasive grains contained in the slurry; the same applies hereinafter), from the viewpoint of further improving the polishing rate for the insulating material. The content of the cerium oxide (for example, ceria) in the abrasive grains is preferably 95% by mass or less, more preferably 92% by mass or less, even more preferably 90% by mass or less, particularly preferably 88% by mass or less, and extremely preferably 85% by mass or less, on the basis of the whole abrasive grains, from the viewpoint of further improving the polishing rate for the insulating material. From these viewpoints, the content of the cerium oxide in the abrasive grains is preferably 50 to 95% by mass, more preferably 60 to 92% by mass, even more preferably 70 to 90% by mass, particularly preferably 80 to 88% by mass, and extremely preferably 80 to 85% by mass, on the basis of the whole abrasive grains.

The content of the cerium oxide (for example, ceria) in the first particles is preferably 50% by mass or more, more preferably 70% by mass or more, even more preferably 90% by mass or more, and particularly preferably 95% by mass or more, on the basis of the whole first particles (the whole first particles contained in the slurry; the same applies hereinafter), from the viewpoint of further improving the polishing rate for the insulating material. The first particles may be an embodiment substantially composed of cerium oxide (for example, ceria) (an embodiment in which 100% by mass of the first particles are substantially cerium oxide). That is, the content of the cerium oxide in the first particles may be 100% by mass or less on the basis of the whole first particles.

The content of the first particles is preferably 0.01% by mass or more, more preferably 0.05% by mass or more, even more preferably 0.1% by mass or more, particularly preferably 0.3% by mass or more, extremely preferably 0.4% by mass or more, and highly preferably 0.5% by mass or more, on the basis of the total mass of the slurry, from the viewpoint of further improving the polishing rate for the insulating material. The content of the first particles is preferably 10% by mass or less, more preferably 5% by mass or less, and even more preferably 1% by mass or less, on the basis of the total mass of the slurry, from the viewpoint of further improving the storage stability of the slurry. From these viewpoints, the content of the first particles is preferably 0.01 to 10% by mass, more preferably 0.05 to 5% by mass, even more preferably 0.1 to 1% by mass, particularly preferably 0.3 to 1% by mass, extremely preferably 0.4 to 1% by mass, and highly preferably 0.5 to 1% by mass, on the basis of the total mass of the slurry.

The content of the hydroxide of a tetravalent metal element in the abrasive grains is preferably 5% by mass or more, more preferably 8% by mass or more, even more preferably 10% by mass or more, particularly preferably 12% by mass or more, and extremely preferably 15% by mass or more, on the basis of the whole abrasive grains (the whole abrasive grains contained in the slurry), from the viewpoint of further improving the polishing rate for the insulating material. The content of the hydroxide of a tetravalent metal element in the abrasive grains is preferably 50% by mass or less, more preferably 40% by mass or less, even more preferably 30% by mass or less, and particularly preferably 20% by mass or less, on the basis of the whole abrasive grains, from the viewpoints of easily preparing the slurry and further improving the polishing rate for the insulating material. From these viewpoints, the content of the hydroxide of a tetravalent metal element in the abrasive grains is preferably 5 to 50% by mass, more preferably 8 to 40% by mass, even more preferably 10 to 30% by mass, particularly preferably 12 to 20% by mass, and extremely preferably 15 to 20% by mass, on the basis of the whole abrasive grains.

The content of the hydroxide of a tetravalent metal element in the second particles is preferably 50% by mass or more, more preferably 70% by mass or more, even more preferably 90% by mass or more, and particularly preferably 95% by mass or more, on the basis of the whole second particles (the whole second particles contained in the slurry; the same applies hereinafter), from the viewpoint of further improving the polishing rate for the insulating material. The second particles may be an embodiment substantially composed of a hydroxide of a tetravalent metal element (an embodiment in which 100% by mass of the second particles are substantially a hydroxide of a tetravalent metal element). That is, the content of the hydroxide of a tetravalent metal element in the second particles may be 100% by mass or less on the basis of the whole second particles.

The content of the hydroxide of a tetravalent metal element in the slurry is preferably 0.005% by mass or more, more preferably 0.01% by mass or more, even more preferably 0.03% by mass or more, particularly preferably 0.05% by mass or more, and extremely preferably 0.1% by mass or more, on the basis of the total mass of the slurry, from the viewpoints of improving the chemical interaction between the abrasive grains and the surface to be polished and further improving the polishing rate for the insulating material. The content of the hydroxide of a tetravalent metal element in the slurry is preferably 5% by mass or less, more preferably 4% by mass or less, even more preferably 3% by mass or less, particularly preferably 2% by mass or less, extremely preferably 1% by mass or less, and highly preferably 0.5% by mass or less, on the basis of the total mass of the slurry, from the viewpoints of easily avoiding the aggregation of the abrasive grains, obtaining a favorable chemical interaction between the abrasive grains and the surface to be polished, and enabling the characteristics of the abrasive grains to be utilized effectively. From these viewpoints, the content of the hydroxide of a tetravalent metal element is preferably 0.005 to 5% by mass, more preferably 0.01 to 4% by mass, even more preferably 0.03 to 3% by mass, particularly preferably 0.05 to 2% by mass, extremely preferably 0.1 to 1% by mass, and highly preferably 0.1 to 0.5% by mass, on the basis of the total mass of the slurry.

The content of the second particles is preferably 5% by mass or more, more preferably 8% by mass or more, even more preferably 10% by mass or more, particularly preferably 12% by mass or more, and extremely preferably 15% by mass or more, on the basis of the total amount of the first particles and the second particles, from the viewpoint of further improving the polishing rate for the insulating material. The content of the second particles is preferably 50% by mass or less, more preferably 40% by mass or less, even more preferably 30% by mass or less, and particularly preferably 20% by mass or less, on the basis of the total amount of the first particles and the second particles, from the viewpoints of easily preparing the slurry and further improving the polishing rate for the insulating material. From these viewpoints, the content of the second particles may be preferably 5 to 50% by mass, more preferably 8 to 40% by mass, even more preferably 10 to 30% by mass, particularly preferably 12 to 20% by mass, and extremely preferably 15 to 20% by mass, on the basis of the total amount of the first particles and the second particles.

The content of the second particles is preferably 0.005% by mass or more, more preferably 0.01% by mass or more, even more preferably 0.03% by mass or more, particularly preferably 0.05% by mass or more, and extremely preferably 0.1% by mass or more, on the basis of the total mass of the slurry, from the viewpoints of improving the chemical interaction between the abrasive grains and the surface to be polished and further improving the polishing rate for the insulating material. The content of the second particles is preferably 5% by mass or less, more preferably 4% by mass or less, even more preferably 3% by mass or less, particularly preferably 2% by mass or less, extremely preferably 1% by mass or less, and highly preferably 0.5% by mass or less, on the basis of the total mass of the slurry, from the viewpoints of easily avoiding the aggregation of the abrasive grains, obtaining a favorable chemical interaction between the abrasive grains and the surface to be polished, and enabling the characteristics of the abrasive grains to be utilized effectively. From these viewpoints, the content of the second particles is preferably 0.005 to 5% by mass, more preferably 0.01 to 4% by mass, even more preferably 0.03 to 3% by mass, particularly preferably 0.05 to 2% by mass, extremely preferably 0.1 to 1% by mass, and highly preferably 0.1 to 0.5% by mass, on the basis of the total mass of the slurry.

The content of the abrasive grains is preferably 0.01% by mass or more, more preferably 0.03% by mass or more, even more preferably 0.05% by mass or more, particularly preferably 0.07% by mass or more, extremely preferably 0.1% by mass or more, highly preferably 0.15% by mass or more, still even more preferably 0.3% by mass or more, and especially preferably 0.5% by mass or more, on the basis of the total mass of the slurry, from the viewpoint of further improving the polishing rate for the insulating material. The content of the abrasive grains is preferably 10% by mass or less, more preferably 8% by mass or less, and even more preferably 6% by mass or less, on the basis of the total mass of the slurry, from the viewpoint of further improving the storage stability of the slurry. From these viewpoints, the content of the abrasive grains is preferably 0.01 to 10% by mass, more preferably 0.03 to 8% by mass, even more preferably 0.05 to 6% by mass, particularly preferably 0.07 to 6% by mass, extremely preferably 0.1 to 6% by mass, highly preferably 0.15 to 6% by mass, still even more preferably 0.3 to 6% by mass, and especially preferably 0.5 to 6% by mass, on the basis of the total mass of the slurry.

Furthermore, it is preferable that the content of the abrasive grains is further decreased from the viewpoint that the cost and polishing scratches can be further reduced. Generally, when the content of the abrasive grains becomes smaller, the polishing rate for an insulating material or the like also tends to decrease. On the other hand, since abrasive grains including particles that contain a hydroxide of a tetravalent metal element can obtain a predetermined polishing rate even with a small amount, the content of the abrasive grains can be further reduced while a balance is achieved between the polishing rate and the advantage of reducing the content of the abrasive grains. From this viewpoint, the content of the abrasive grains may be 5% by mass or less, 4% by mass or less, 3% by mass or less, 2% by mass or less, or 1% by mass or less, on the basis of the total mass of the slurry. That is, for example, the content of the abrasive grains may be 0.01% to 5% by mass, 0.03% to 4% by mass, 0.05% to 3% by mass, 0.07% to 2% by mass, 0.1% to 1% by mass, 0.15% to 1% by mass, 0.3% to 1% by mass, or 0.5% to 1% by mass, on the basis of the total mass of the slurry.

[Absorbance]

It is preferable that the second particles contain a hydroxide of a tetravalent metal element while satisfying at least one of the conditions (a) and (b) below. Incidentally, an "aqueous dispersion liquid" having the content of the second particles adjusted to a predetermined amount means a liquid containing a predetermined amount of the second particles and water.

(a) The second particles provide an absorbance of 1.00 or higher for light having a wavelength of 400 nm in an aqueous dispersion liquid having the content of the second particles adjusted to 1.0% by mass.

(b) The second particles provide an absorbance of 1.000 or higher for light having a wavelength of 290 nm in an aqueous dispersion liquid having the content of the second particles adjusted to 0.0065% by mass.

With regard to the above-described condition (a), by using particles that provide an absorbance of 1.00 or higher for light having a wavelength of 400 nm in an aqueous dispersion liquid having the content of the second particles adjusted to 1.0% by mass, the polishing rate can be further improved. The reasons for this are not necessarily clearly known; however, the present inventors speculate the reasons to be as follows. That is, it is considered that, depending on the production conditions for the hydroxide of a tetravalent metal element, or the like, particles containing $M(OH)_aX_b$ (wherein $a+b \times c=4$) composed of a tetravalent metal ($M^{4+}$), one to three hydroxide ions ($OH^-$), and one to three anions ($X^{c-}$) are produced (incidentally, such particles are also "particles containing a hydroxide of a tetravalent metal element"). It is speculated that, in $M(OH)_aX_b$, an electron-withdrawing anion ($X^{c-}$) acts so that the reactivity of hydroxide ion is enhanced, and the polishing rate is improved along with an increase in the abundance of $M(OH)_aX_b$. Furthermore, it is considered that, since particles containing $M(OH)_aX_b$ absorbs light having a wavelength of 400 nm, the polishing rate is improved along with an increase in the abundance of $M(OH)_aX_b$ for increasing the absorbance for light having a wavelength of 400 nm.

It is considered that particles containing a hydroxide of a tetravalent metal element can contain not only $M(OH)_aX_b$ but also $M(OH)_4$, $MO_2$, and the like. Examples of the anion ($X^{c-}$) include $NO_3^-$ and $SO_4^{2-}$.

Incidentally, whether the particles containing a hydroxide of a tetravalent metal element contains $M(OH)_aX_b$ can be checked by a method of thoroughly washing the particles with pure water and then detecting peaks corresponding to the anion ($X^{c-}$) by FT-IR ATR method (Fourier transform Infra Red Spectrometer Attenuated Total Reflection method). The presence of the anion ($X^{c-}$) can also be checked by XPS method (X-ray Photoelectron Spectroscopy).

Here, it has been confirmed that an absorption peak at a wavelength of 400 nm of $M(OH)_aX_b$ (for example, $M(OH)_3X$) is much smaller than the below-mentioned absorption peak at a wavelength of 290 nm. In this regard, the present inventors conducted an investigation on the magnitude of the absorbance using an aqueous dispersion liquid having a content of 1.0% by mass, which has a relatively large content of particles and whose absorbance is likely to be detected to be high, and as a result, the present inventors found that, in the case of using particles having an absorbance of 1.00 or higher for light having a wavelength of 400 nm in the aqueous dispersion liquid, an effect of improving the polishing rate is excellent.

The absorbance for light having a wavelength of 400 nm is preferably 1.50 or higher, more preferably 1.55 or higher, and even more preferably 1.60 or higher, from the viewpoint that it becomes easier to polish an insulating material at a further excellent polishing rate.

With regard to the above-described condition (b), by using second particles having an absorbance of 1.000 or higher for light having a wavelength of 290 nm in an aqueous dispersion liquid having the content of the second particles adjusted to 0.0065% by mass, the polishing rate can be further improved. The reason for this is not clearly understood; however, the present inventors speculate the reason as follows. That is, particles containing $M(OH)_aX_b$ (for example, $M(OH)_3X$), that are produced depending on the production conditions for the hydroxide of a tetravalent metal element and the like, have an absorption peak near the wavelength of 290 nm according to calculations, and for example, particles composed of $Ce^{4+}(OH^-)_3NO_3^-$ have an absorption peak at the wavelength of 290 nm. Therefore, it is considered that, as the abundance of $M(OH)_aX_b$ increases and thereby the absorbance for light having a wavelength of 290 nm increases, the polishing rate is improved.

Here, the absorbance for light having a wavelength of about 290 nm tends to be detected to a greater degree as the measuring limit is exceeded. In this regard, the present inventors conducted an investigation on the magnitude of the absorbance using an aqueous dispersion liquid having a content of 0.0065% by mass, which has a relatively small content of particles and whose absorbance is easily detected to a small degree, and as a result, the present inventors found that the effect of improving the polishing rate is excellent in the case of using particles that provide an absorbance of 1.000 or higher for light having a wavelength of 290 nm in the aqueous dispersion liquid.

From the viewpoint of polishing an insulating material at a further excellent polishing rate, the absorbance for light having a wavelength of 290 nm is more preferably 1.050 or higher, even more preferably 1.100 or higher, particularly preferably 1.130 or higher, and extremely preferably 1.150 or higher. The upper limit of the absorbance for light having a wavelength of 290 nm is not particularly limited; however, it is preferably 10.00 or lower. That is, the absorbance for light having a wavelength of 290 nm is preferably 1.000 to 10.00, more preferably 1.050 to 10.00, even more preferably 1.100 to 10.00, particularly preferably 1.130 to 10.00, and extremely preferably 1.150 to 10.00.

In a case in which the second particles, that provide an absorbance of 1.00 or higher for light having a wavelength of 400 nm, provide an absorbance of 1.000 or higher for light having a wavelength of 290 nm in an aqueous dispersion liquid having the content of the second particles adjusted to 0.0065% by mass, an insulating material can be polished at a further excellent polishing rate.

Furthermore, a hydroxide of a tetravalent metal element (for example, $M(OH)_aX_b$) tends not to absorb light having a wavelength of 450 nm or higher (particularly, a wavelength of 450 to 600 nm). Therefore, from the viewpoint of suppressing adverse influence on polishing as a result of containing impurities, and thereby polishing an insulating material at a further excellent polishing rate, it is preferable that the second particles provide an absorbance of 0.010 or lower for light having a wavelength of 450 to 600 nm in an aqueous dispersion liquid having the content of the second particles adjusted to 0.0065% by mass (65 ppm). That is, it is preferable that the absorbance for entire light in the wavelength range of 450 to 600 nm in an aqueous dispersion liquid having the content of the second particles adjusted to 0.0065% by mass does not exceed 0.010. The absorbance for light having a wavelength of 450 to 600 nm is more preferably lower than 0.010. The lower limit of the absorbance for light having a wavelength of 450 to 600 nm is preferably 0.

The absorbance in an aqueous dispersion liquid can be measured using, for example, a spectrophotometer (apparatus name: U3310) manufactured by Hitachi, Ltd. Specifically, for example, an aqueous dispersion liquid having the content of the second particles adjusted to 1.0% by mass or 0.0065% by mass is prepared as a measurement sample. About 4 mL of this measurement sample is introduced into a 1-cm square cell, and the cell is placed in the apparatus. Next, measurement of the absorbance is performed in the wavelength range of 200 to 600 nm, and the absorbance is determined from a chart thus obtained.

[Light Transmittance]

It is preferable that the second particles contained in the slurry of the present embodiment provide a light transmittance of 50%/cm or higher for light having a wavelength of 500 nm in an aqueous dispersion liquid having the content of the second particles adjusted to 1.0% by mass. Thereby, a decrease in the polishing rate due to the addition of an additive can be further suppressed, and therefore, it becomes easy to obtain other characteristics while maintaining the polishing rate. From this viewpoint, the light transmittance is more preferably 60%/cm or higher, even more preferably 70%/cm or higher, particularly preferably 80%/cm or higher, extremely preferably 90%/cm or higher, and highly preferably 92%/cm or higher. The upper limit of the light transmittance is 100%/cm.

The reason why it is possible to suppress a decrease in the polishing rate by adjusting the light transmittance of the particles like this is not understood in detail; however, the present inventors consider the reason as follows. It is considered that, in particles containing a hydroxide of a tetravalent metal element (cerium or the like), chemical action becomes predominant over mechanical action. Therefore, it is considered that the number of particles contributes to the polishing rate rather than the size of the particles.

In a case in which the light transmittance of an aqueous dispersion liquid having a content of the particles of 1.0% by mass is low, it is considered that the particles present in the aqueous dispersion liquid contain a relatively larger portion of particles having a large particle size (hereinafter, referred to as "coarse particles"). When an additive (for example, polyvinyl alcohol (PVA)) is added to a slurry containing such particles, coarse particles serve as nuclei, and other particles aggregate around thereon. As a result, it is considered that, since the number of particles acting on the surface to be polished per unit area (effective number of particles) is reduced, and the specific surface area of the particles that are in contact with the surface to be polished is reduced, a decrease in the polishing rate is induced.

On the other hand, in a case in which the light transmittance in an aqueous dispersion liquid having a content of particles of 1.0% by mass is high, it is considered that the particles present in the aqueous dispersion liquid are in a state in which there are few "coarse particles". In a case in which the abundance of coarse particles is small like this, even if an additive (for example, polyvinyl alcohol) is added to the slurry, since there are few coarse particles that become the nuclei of aggregation, aggregation between particles is suppressed, or the size of the aggregated particles becomes smaller compared to the aggregated particles which are produced in a conventional slurry. As a result, it is considered that, since the number of particles acting on the surface to be polished per unit area (effective number of particles) is maintained, and the specific surface area of the particles that are in contact with the surface to be polished is maintained, a decrease in the polishing rate does not easily occur.

According to the investigation of the present inventors, it can be seen that, even for slurries having the same particle size measured with a general particle size analyzer, there may be a slurry that is visually transparent (the light transmittance is high) and a slurry that is visually cloudy (the light transmittance is low). From this, it is considered that coarse particles that can cause such action as described above contribute to a decrease in the polishing rate even with a very small amount that is undetectable with a general particle size analyzer.

Furthermore, it can be seen that, even if filtration is repeated several times in order to reduce coarse particles, there is a case in which the phenomenon that the polishing rate is decreased by an additive is not much ameliorated, and the above-described effect of improving the polishing rate due to the absorbance is sufficiently exhibited. Thus, the present inventors found that the above-described problems can be solved by devising the production method for particles or the like and using particles having a high light transmittance in an aqueous dispersion liquid.

The light transmittance is a transmittance for light having a wavelength of 500 nm. The light transmittance can be measured with a spectrophotometer. Specifically, for example, it can be measured with a spectrophotometer U3310 (apparatus name) manufactured by Hitachi, Ltd.

As a more specific measurement method, an aqueous dispersion liquid having the content of the second particles adjusted to 1.0% by mass is prepared as a measurement sample. About 4 mL of this measurement sample is introduced into a 1-cm square cell, the cell is placed in the apparatus, and then measurement is performed.

The absorbance and light transmittance that are provided in the aqueous dispersion liquid by the second particles contained in the slurry can be measured by removing solid components other than the second particles and liquid components other than water, subsequently preparing an aqueous dispersion liquid having a predetermined content, and performing measurement using this aqueous dispersion liquid. It may vary depending on the components contained in the slurry; however, for the removal of solid components and liquid components, for example, a centrifugation method such as centrifugation using a centrifuge (centrifugal separator) that can apply a gravitational acceleration of several thousand G or less, or super-centrifugation using a super-centrifuge (super-centrifugal separator) that can apply a gravitational acceleration of several ten thousand G or greater; a chromatographic method such as partition chromatography, adsorption chromatography, gel permeation chromatography, or ion exchange chromatography; a filtration method such as natural filtration, filtration under reduced pressure, pressure filtration, or ultrafiltration; and a distillation method such as reduced pressure distillation or normal pressure distillation, can be used, and these may also be used in combination as appropriate.

For example, in a case in which a compound having a weight average molecular weight of several ten thousands or more (for example, 50000 or more) is contained, examples of a separation method for the second particles include a chromatographic method and a filtration method, and among these, at least one selected from the group consisting of gel permeation chromatography and ultrafiltration is preferred. In the case of using a filtration method, the particles contained in the slurry can be passed through a filter by setting appropriate conditions. In a case in which a compound having a weight average molecular weight of several ten thousands or less (for example, less than 50000) is contained, examples of the separation method for the second particles include a chromatographic method, a filtration method, and a distillation method, and at least one selected from the group consisting of gel permeation chromatography, ultrafiltration, and distillation under reduced pressure is preferred. In a case in which a plurality of kinds of particles is contained, examples of the separation method for the second particles include a filtration method and a centrifugation method, and more particles containing a hydroxide of a tetravalent metal element are contained in the filtrate in the case of filtration, while more particles are contained in the liquid phase in the case of centrifugation. Incidentally, in the present specification, a weight-average molecular weight is measured by gel permeation chromatography (GPC) under the following conditions, using a calibration curve of standard polystyrene.

Instrument used: Hitachi L-6000 Model [manufactured by Hitachi, Ltd.]

Column: Gel-Pak GL-R420+Gel-Pak GL-R430+Gel-Pak GL-R440 [manufactured by Hitachi Chemical Company, Ltd., trade names, three columns in total]

Eluent: tetrahydrofuran

Measurement temperature: 40° C.

Flow rate: 1.75 mL/min

Detector: L-3300RI [manufactured by Hitachi, Ltd.]

As a method of separating solid components other than the second particles, for example, it is possible to separate under the following conditions for centrifugation.

Centrifuge: Optima MAX-TL (manufactured by Beckman Coulter, Inc.)

Centrifugation acceleration: 40000G

Treatment time: 5 minutes

Treatment temperature: 25° C.

Examples of the method of separating the second particles by a chromatographic method include the method of isolating the second particles, the method of isolating other components, and the combination of these methods, under the following conditions.

Sample solution: 100 μL of slurry

Detector: Manufactured by Hitachi, Ltd., UV-VIS detector, trade name "L-4200"

Wavelength: 400 nm

Integrator: Manufactured by Hitachi, Ltd., GPC integrator, trade name "D-2500"

Pump: Manufactured by Hitachi, Ltd., trade name "L-7100"

Column: Manufactured by Hitachi Chemical Co., Ltd., water-based packed column for HPLC, trade name "GL-W550S"

Eluent: Deionized water

Measurement temperature: 23° C.

Flow rate: 1 mL/min (pressure is about 40 to 50 kg/cm$^2$)

Measurement time: 60 minutes

Depending on the components contained in the slurry, there is a possibility that the second particles may not be isolated even under the above-described conditions; however, in that case, it is possible to separate by optimizing the amount of the sample solution, the type of column, the type of eluent, the measurement temperature, the flow rate, and the like. Furthermore, there is a possibility that it is possible to separate from the second particles by adjusting the pH of the slurry to adjust the distillation time for the components contained in the slurry. In a case in which there are insoluble components in the slurry, it is preferable to remove the insoluble components by filtration, centrifugation, or the like, according to necessity.

[Method for Producing Second Particles]

A hydroxide of a tetravalent metal element can be produced by reacting a salt (metal salt) of a tetravalent metal element with an alkali source (base). It is preferable that the hydroxide of a tetravalent metal element is produced by mixing a salt of a tetravalent metal element with an alkali solution (for example, an aqueous alkali solution). Thereby, particles having a very fine particle size can be obtained, and a slurry having a further excellent effect of reducing polishing scratching can be obtained. Such a technique is disclosed in, for example, Patent Literatures 6 and 7. A hydroxide of a tetravalent metal element can be obtained by mixing a metal salt solution of a salt of a tetravalent metal element (for example, an aqueous solution of a metal salt) with an alkali solution. As the salt of a tetravalent metal element, conventionally known salts can be used without any particular limitations, and examples include $M(NO_3)_4$, $M(SO_4)_2$, $M(NH_4)_2(NO_3)_6$, $M(NH_4)_4(SO_4)_4$ (wherein M represents a rare earth metal element), and $Zr(SO_4)_2 \cdot 4H_2O$. Cerium (Ce) which is chemically active is preferable for M.

(Salt of Compound Represented by Formula (1))

The slurry of the present embodiment contains the salt of the compound represented by above-described formula (1). In the present embodiment, the slurry containing first particles and second particles as the abrasive grains further contains the salt of the compound represented by formula (1), and thus an increase in particle size caused by the aggregation of the abrasive grains hardly occurs and a deterioration in polishing characteristics can be suppressed. That is, since the slurry contains the salt of the compound represented by formula (1), the storage stability of the slurry is improved and the polishing characteristics (for example, the polishing rate for the insulating material) after long-term storage are improved. Therefore, according to the slurry of the present embodiment, polishing can be stably performed. Such an effect is remarkable in a case in which the zeta potential of the first particles is negative and the zeta potential of the second particles is positive. Furthermore, in the related art, a material having a carboxyl group may be used in order to suppress the aggregation of the abrasive grains, but in such a conventional polishing liquid, a sufficient polishing rate for the insulating material tends not to be obtainable. On the other hand, in the present embodiment, since the salt of the compound represented by formula (1) is used, a sufficient polishing rate is easily obtainable as compared with a conventional polishing liquid.

In the case of using the compound represented by formula (1) (for example, phosphoric acid) without using the salt of the compound represented by formula (1), the effect of improving the storage stability of the slurry is not obtainable. An example of the reason for this is speculated as follows. In the case of using the salt of the compound represented by formula (1), since the salt is adsorbed to the abrasive grains in a state in which a hydroxyl group in the salt of the compound represented by formula (1) is dissociated so that the surface of the abrasive grains is charged (negatively charged) due to the dissociated hydroxyl group, the aggregation of the abrasive grains is suppressed by electrical repulsion between the abrasive grains. On the other hand, in the case of using the compound represented by formula (1) (for example, phosphoric acid), since the compound is difficult to adsorb to the abrasive grains in a state in which a hydroxyl group in the compound represented by formula (1) is dissociated, the surface of the abrasive grains is difficult to be charged, and thus the aggregation of the abrasive grains cannot be suppressed.

Examples of the monovalent organic group of the salt of the compound represented by formula (1) include an alkyl group, an aryl group, and a vinyl group. At least one hydrogen atom of these organic groups may be substituted with another functional group (substituent). Examples of the functional group (substituent) include a hydroxyl group, a phosphoric acid group, a phosphate group, a phosphorus acid group, and a phosphite group. Examples of the salts of the phosphate group or the phosphite group include an alkali metal salt, an alkaline-earth metal salt, and an ammonium salt (a group in which the hydrogen atom of the hydroxyl group is substituted with an alkali metal, an alkaline-earth metal, an ammonium ion, or the like). For example, the monovalent organic group may be an alkyl group in which at least one hydrogen atom is substituted with a phosphate group or a phosphite group. Among the monovalent organic groups, from the viewpoint of further improving the storage stability of the slurry, an alkyl group is preferred. The alkyl group may be saturated or unsaturated and may be linear, branched, or cyclic. The number of carbon atoms of the alkyl group may be, for example, 1 to 4.

The salt of the compound represented by formula (1) is represented, for example, by formula (2) below or formula (3) below. The salt of the compound represented by formula (1) can contain at least one selected from the group consisting of a compound (salt) represented by formula (2) below and a compound (salt) represented by formula (3) below, from the viewpoint of further improving the storage stability of the slurry.

[Chemical Formula 4]

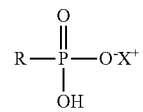

(2)

[In formula (2), R represents a hydroxyl group or a monovalent organic group, and $X^+$ represents a counter ion.]

[Chemical Formula 5]

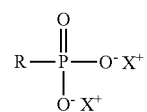

(3)

[In formula (3), R represents a hydroxyl group or a monovalent organic group, and $X^+$ represents a counter ion.]

Examples of the counter ion include an alkali metal cation, an alkaline earth metal cation, and an ammonium ion.

Among these, from the viewpoint of further improving the stability of the slurry and the viewpoint of preventing metal contamination of the polished surface, an ammonium ion is preferred. That is, the salt of the compound represented by formula (1) preferably contains an ammonium salt. The hydrogen atom of the ammonium ion may be substituted with an alkyl group or the like.

The salt of the compound represented by formula (1) preferably contains a salt of a compound in which the R is a hydroxyl group or an alkyl group and more preferably contains a salt of a compound in which the R is a hydroxyl group, from the viewpoint of further improving the storage stability of the slurry. At least one selected from the group consisting of the salt of the compound represented by formula (2) and the salt of the compound represented by formula (3) preferably contains a salt of a compound in which the R is a hydroxyl group or an alkyl group and more preferably contains a salt of a compound in which the R is a hydroxyl group, from the viewpoint of further improving the storage stability of the slurry.

The salt of the compound represented by formula (1) can contain at least one selected from the group consisting of a salt of monophosphonic acid and a salt of polyphosphonic acid. The salt of the compound represented by formula (1) may be used singly or in combination of plural kinds thereof.

Specific examples of the monophosphonic acid include phosphoric acid, vinylphosphonic acid, ethylphosphonic acid, and methylphosphonic acid. Examples of the salt of phosphoric acid include diammonium hydrogen phosphate and ammonium dihydrogen phosphate.

The salt of polyphosphonic acid preferably contains a salt of diphosphonic acid from the viewpoint of further improving the storage stability of the slurry. The salt of the compound represented by formula (1) preferably contains a salt of a compound represented by formula (1a) below from the viewpoint of further improving the storage stability of the slurry.

[Chemical Formula 6]

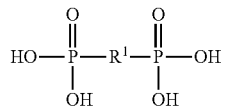

(1a)

[In formula (1a), $R^1$ represents a divalent organic group.]

Examples of the divalent organic group of the salt of the compound represented by formula (1a) include an alkylene group. At least one hydrogen atom of the organic group may be substituted with another functional group (substituent). Examples of the functional group (substituent) include a hydroxyl group, a phosphoric acid group, a phosphate group, a phosphorus acid group, and a phosphite group. Examples of the salts of the phosphate group or the phosphite group include an alkali metal salt, an alkaline-earth metal salt, and an ammonium salt (a group in which the hydrogen atom of the hydroxyl group is substituted with an alkali metal, an alkaline-earth metal, an ammonium ion, or the like). For example, the divalent organic group may be an alkylene group in which at least one hydrogen atom is substituted with a hydroxyl group.

At least one hydrogen atom of the hydroxyl group in the salt of the compound represented by formula (1a) may be substituted with a counter ion. As the counter ion, for example, the aforementioned counter ions exemplified as $X^+$ can be used, and from the viewpoint of further improving the storage stability of the slurry, an ammonium ion is preferred.

The salt of the compound represented by formula (1a) preferably contains hydroxyalkane bisphosphonate from the viewpoint of further improving the storage stability of the slurry. The hydroxyalkane bisphosphonate preferably contains an ammonium salt from the viewpoint of further improving the storage stability of the slurry. The hydroxyalkane bisphosphonate preferably contains hydroxyethane bisphosphonate from the viewpoint of further improving the storage stability of the slurry. From these viewpoints, the hydroxyalkane bisphosphonate preferably contains 1-hydroxyethane-1,1-bis(phosphonic acid) ammonium.

As the salt of the compound represented by formula (1), from the viewpoint of further improving the storage stability of the slurry and the polishing rate, at least one selected from the group consisting of diammonium hydrogen phosphate, ammonium dihydrogen phosphate, and hydroxyalkane bisphosphonate is preferably used, and at least one selected from the group consisting of diammonium hydrogen phosphate and ammonium dihydrogen phosphate is more preferably used.

The content of the salt of the compound represented by formula (1) is preferably 0.001% by mass or more, more preferably 0.003% by mass or more, and even more preferably 0.005% by mass or more, on the basis of the total mass of the slurry, from the viewpoint of further improving the storage stability of the slurry. The content of the salt of the compound represented by formula (1) is preferably 0.1% by mass or less, more preferably 0.05% by mass or less, and even more preferably 0.03% by mass or less, on the basis of the total mass of the slurry, from the viewpoint of further improving the storage stability of the slurry and the viewpoint of further suppressing a decrease in polishing rate (for example, the polishing rate for the insulating material). From these viewpoints, the content of the salt of the compound represented by formula (1) is preferably 0.001 to 0.1% by mass, more preferably 0.003 to 0.05% by mass, and even more preferably 0.005 to 0.03% by mass, on the basis of the total mass of the slurry.

The content of the salt of the compound represented by formula (1) is preferably 0.007% by mass or more and more preferably 0.01% by mass or more, on the basis of the total mass of the slurry, from the viewpoint of further suppressing a decrease in polishing rate (for example, the polishing rate for the insulating material). The content of the salt of the compound represented by formula (1) is preferably 0.025% by mass or less, more preferably 0.02% by mass or less, and even more preferably 0.015% by mass or less, on the basis of the total mass of the slurry, from the viewpoint of further suppressing a decrease in polishing rate (for example, the polishing rate for the insulating material).

The content of the salt of the content represented by formula (1) with respect to 100 parts by mass of the abrasive grains in the slurry is preferably 0.05 part by mass or more, more preferably 0.25 part by mass or more, even more preferably 0.5 part by mass or more, and particularly preferably 0.7 part by mass or more, from the viewpoint of further improving the storage stability of the slurry. The content of the salt of the compound represented by formula (1) with respect to 100 parts by mass of the abrasive grains in the slurry is preferably 5.0 parts by mass or less, more preferably 3.5 parts by mass or less, even more preferably 3.0 parts by mass or less, and particularly preferably 2.0 parts by mass or less, from the viewpoint of further improving the storage stability of the slurry and the viewpoint of further suppressing a decrease in polishing rate (for example, the polishing rate for the insulating material). From these viewpoints, the content of the salt of the compound represented by formula (1) with respect to 100 parts by mass of the abrasive grains in the slurry is preferably 0.05 to 5.0 parts by mass, more preferably 0.25 to 3.0 parts by mass, and even more preferably 0.5 to 2.0 parts by mass. The content of the salt of the compound represented by formula (1) with respect to 100 parts by mass of the abrasive grains in the slurry is preferably 0.8 part by mass, more preferably 1.0 part by mass or more, even more preferably 1.5 parts by mass, and particularly preferably 1.6 parts by mass, on the basis of the total mass of the slurry, from the viewpoint of further suppressing a decrease in polishing rate (for example, the polishing rate for the insulating material).

(Optional Components)

The slurry of the present embodiment may further contain optional additives (excluding the salt of the compound represented by formula (1)) for the purpose of adjusting the polishing characteristics, or the like. Examples of the optional additives include a material having a carboxyl group (excluding a compound corresponding to a polyoxyalkylene compound or a water-soluble polymer), a polyoxyalkylene compound, a water-soluble polymer, and an oxidizing agent (for example, hydrogen peroxide). The respective additives can be used singly or in combination of two or more kinds thereof.

Optional additives (a water-soluble polymer or the like) have an effect by which the dispersion stability of the abrasive grains in the slurry can be increased, and an insulating material (for example, silicon oxide) can be polished at a higher rate. Furthermore, since an insulating material (for example, silicon oxide) can be polished at high rate, the level difference elimination property is enhanced, and high flattening properties can also be obtained. This is considered to be because the polishing rate for convex portions is improved to a large extent compared to concave portions.

Examples of the material having a carboxyl group include monocarboxylic acids such as acetic acid, propionic acid, butyric acid, or valeric acid; hydroxy acids such as lactic acid, malic acid, or citric acid; dicarboxylic acids such as malonic acid, succinic acid, fumaric acid, or maleic acid; polycarboxylic acids such as polyacrylic acid or polymaleic acid; and amino acids such as arginine, histidine, or lysine.

From the viewpoint of easily exhibiting the high polishing rate for the insulating material, the weight average molecular weight of the material having a carboxyl group is preferably 100000 or less, more preferably 80000 or less, even more preferably 60000 or less, particularly preferably 50000 or less, and extremely preferably 10000 or less. From the viewpoint that appropriate dispersibility can be maintained, the weight average molecular weight of the material having a carboxyl group is preferably 1000 or more, more preferably 1500 or more, even more preferably 2000 or more, and particularly preferably 5000 or more.

The content of the material having a carboxyl group is preferably 0.01% to 10% by mass on the basis of the total mass of the slurry. Thereby, an insulating material is easily polished at a high polishing rate while aggregation between abrasive grains is suppressed.

Examples of the polyoxyalkylene compound include a polyalkylene glycol and a polyoxyalkylene derivative.

Examples of the polyalkylene glycol include polyethylene glycol, polypropylene glycol, and polybutylene glycol. The polyalkylene glycol is preferably at least one selected from the group consisting of polyethylene glycol and polypropylene glycol, and is more preferably polyethylene glycol.

A polyoxyalkylene derivative is, for example, a compound obtained by introducing a functional group or a substituent to a polyalkylene glycol, or a compound obtained by adding a polyalkylene oxide to an organic compound. Examples of the functional group or a substituent include an alkyl ether group, an alkyl phenyl ether group, a phenyl ether group, a styrenated phenyl ether group, a glyceryl ether group, an alkylamine group, a fatty acid ester group, and a glycol ester group. Examples of the polyoxyalkylene derivative include a polyoxyethylene alkyl ether, polyoxyethylene bisphenol ether (for example, manufactured by NIPPON NYUKAZAI CO., LTD., BA GLYCOL series), polyoxyethylene styrenated phenyl ether (for example, manufactured by Kao Corporation, EMULGEN series), a polyoxyethylene alkyl phenyl ether (for example, manufactured by DKS Co. Ltd., NOIGEN EA series), a polyoxyalkylene polyglyceryl ether (for example, manufactured by Sakamoto Yakuhin Kogyo Co., Ltd., SC-E series and SC-P series), a polyoxyethylene sorbitan fatty acid ester (for example, manufactured by DKS Co. Ltd., SORGEN TW series), a polyoxyethylene fatty acid ester (for example, manufactured by Kao Corporation, EMANON series), a polyoxyethylene alkylamine (for example, manufactured by DKS Co. Ltd., AMIRADIN D), and other compounds having a polyalkylene oxide added thereto (for example, manufactured by Nissin Chemical Co., Ltd., SURFINOL 465, and manufactured by NIPPON NYUKAZAI CO., LTD., TMP series).

The weight average molecular weight of the polyoxyalkylene compound is not particularly limited; however, from the viewpoint that appropriate workability and foamability are easily obtainable, it is preferably 100000 or less, more preferably 50000 or less, even more preferably 20000 or less, particularly preferably 10000 or less, and extremely preferably 5000 or less. From the viewpoint that flattening properties are further enhanced, the weight average molecular weight of the polyoxyalkylene compound is preferably 200 or more, more preferably 400 or more, and even more preferably 500 or more.

From the viewpoint that flattening properties are further enhanced, the content of the polyoxyalkylene compound is preferably 0.01% by mass or more, more preferably 0.02% by mass or more, even more preferably 0.1% by mass or more, and particularly preferably 0.2% by mass or more, on the basis of the total mass of the slurry. From the viewpoint that it is easy to obtain an adequate polishing rate, the content of the polyoxyalkylene compound is preferably 5% by mass or less, more preferably 2% by mass or less, and even more preferably 1% by mass or less, on the basis of the total mass of the slurry.

A water-soluble polymer has an effect of adjusting the polishing characteristics such as the dispersion stability of the abrasive grains, flattening properties, in-plane uniformity, polishing selectivity of silicon oxide with respect to silicon nitride (polishing rate for silicon oxide/polishing rate for silicon nitride), or polishing selectivity of silicon oxide with respect to polysilicon (polishing rate for silicon oxide/polishing rate for polysilicon). Here, the "water-soluble polymer" is defined as a polymer that dissolves in an amount of 0.1 g or more in 100 g of water. Incidentally, a polymer that corresponds to the polyoxyalkylene compound is not to be included in the "water-soluble polymer".

The water-soluble polymer is not particularly limited, and examples include acrylic polymers such as polyacrylamide or polydimethylacrylamide; polysaccharides such as carboxymethyl cellulose, agar, curdlan, dextrin, cyclodextrin, or pullulan; vinyl-based polymers such as polyvinyl alcohol, polyvinylpyrrolidone, or polyacrolein; glycerin-based polymers such as polyglycerin or a polyglycerin derivative; and polyethylene glycol. The water-soluble polymers can be used singly or in combination of two or more kinds thereof.

In the case of using a water-soluble polymer, from the viewpoint that an effect of adding a water-soluble polymer is obtained while sedimentation of the abrasive grains is suppressed, the content of the water-soluble polymer is preferably 0.001% by mass or more, more preferably 0.01% by mass or more, even more preferably 0.1% by mass or more, particularly preferably 0.3% by mass or more, and extremely preferably 0.5% by mass or more, on the basis of the total mass of the slurry. From the viewpoint that an effect of adding a water-soluble polymer is obtained while sedimentation of the abrasive grains is suppressed, the content of the water-soluble polymer is preferably 10% by mass or less, more preferably 8% by mass or less, even more preferably 6% by mass or less, particularly preferably 5% by mass or less, extremely preferably 3% by mass or less, and highly preferably 1% by mass or less, on the basis of the total mass of the slurry. In a case in which a plurality of compounds is used as the water-soluble polymer, it is preferable that the total of the contents of the respective compounds satisfies the above-described range.

In the case of using an oxidizing agent, the content of the oxidizing agent is preferably 0.0001% to 10% by mass on the basis of the total mass of the slurry, from the viewpoint that the effect of adding an additive is obtained while sedimentation of the abrasive grains is suppressed.

(Liquid Medium)

The liquid medium in the slurry of the present embodiment is not particularly limited; however, water such as deionized water or ultrapure water is preferred. The content of the liquid medium may correspond to the remaining of the slurry from which the contents of other constituent components are removed, and is not particularly limited.

(Characteristics of Slurry)

From the viewpoint that the polishing rate for an insulating material is further improved, the pH of the slurry of the present embodiment is preferably 2.0 or higher, more preferably 2.5 or higher, even more preferably 2.8 or higher, particularly preferably 3.0 or higher, extremely preferably 3.2 or higher, and highly preferably 3.5 or higher. From the viewpoint that the storage stability of the slurry is further improved, the pH of the slurry is preferably 7.0 or lower, more preferably 6.5 or lower, even more preferably 6.0 or lower, particularly preferably 5.0 or lower, and extremely preferably 4.0 or lower. From these viewpoints, the pH is preferably 2.0 to 7.0, more preferably 2.5 to 6.5, even more preferably 2.8 to 6.0, particularly preferably 3.0 to 5.0, extremely preferably 3.2 to 4.0, and highly preferably 3.5 to 4.0. The pH of the slurry is defined as the pH at a liquid temperature of 25° C.

The pH of the slurry can be adjusted by means of an acid component such as an inorganic acid or an organic acid; an alkali component such as ammonia, sodium hydroxide, tetramethylammonium hydroxide (TMAH), imidazole, or an alkanolamine; or the like. Furthermore, a buffering agent may also be added in order to stabilize the pH. Furthermore, a buffering agent may be added as a buffer solution (a liquid containing a buffering agent). Examples of such a buffer solution include an acetate buffer solution and a phthalate buffer solution.

The pH of the slurry of the present embodiment can be measured with a pH meter (for example, Product No. PHL-40 manufactured by DKK-TOA CORPORATION). Specifically, for example, a pH meter is subjected to two-point calibration using a phthalate pH buffer solution (pH: 4.01) and a neutral phosphate pH buffer solution (pH: 6.86) as standard buffer solutions, subsequently the electrode of the pH meter is introduced into the slurry, and the value after being stabilized after a lapse of two minutes or longer is measured. The liquid temperatures of the standard buffer solutions and the slurry are all set to 25° C.

Even in a case in which the slurry of the present embodiment is stored for a long time, the aggregation of the particles hardly occurs. For example, an increase rate of the D99 particle size when the slurry of the present embodiment is stored at 60° C. for 5 days ($\{[D99$ particle size after storage/D99 particle size before storage$]-1\}\times 100$) is, for example, 10% or less, 5% or less, or 3% or less. The D99 particle size is an index that more significantly shows the quality of storage stability, and when the D99 particle size is increased by more than 10%, there is a concern of occurrence of polishing scratches caused by an increase in coarse particles and a decrease in polishing rate. The increase rate of the D99 particle size is obtained, for example, in such a manner that the slurry is left to stand still in a thermostatic bath set at 60° C. for 5 days and then the D99 particle sizes in the slurry before and after the slurry is left to stand are measured.

The slurry of the present embodiment may be prepared, for example, by mixing a slurry (for example, an aqueous dispersion) containing first particles and a slurry (for example, an aqueous dispersion) containing second particles. At this time, at least one of the slurry containing first particles and the slurry containing second particles contains the salt of the compound represented by formula (1).

In a case in which the slurry of the present embodiment is used as a polishing liquid (for example, CMP polishing liquid), the constituent components of the polishing liquid may be stored as a one-pack polishing liquid, or may be stored as a multi-pack (for example, two-pack) polishing liquid set in which the constituent components of the polishing liquid are divided into a slurry and an additive liquid such that a slurry (first liquid) containing abrasive grains, a liquid medium and the salt of the compound represented by formula (1), and an additive liquid (second liquid) containing additives and a liquid medium are mixed to form the desired polishing liquid. The additive liquid may contain, for example, an oxidizing agent. The constituent components of the polishing liquid may also be stored as a polishing liquid set divided into three or more liquids.

With regard to the polishing liquid set, the slurry (first liquid) and the additive liquid (second liquid) are mixed immediately before polishing or during polishing, and thus a polishing liquid is produced. Furthermore, the one-pack polishing liquid may be stored as a stock solution for polishing liquid, in which the content of the liquid medium has been reduced, and may be used after being diluted with the liquid medium during polishing. The multi-pack polishing liquid set may be stored as a stock solution for slurry and a stock solution for additive liquid, in both of which the content of the liquid medium has been reduced, and may be used after being diluted with the liquid medium during polishing.

In the case of the one-pack polishing liquid, as a method of supplying the polishing liquid onto a polishing platen, a method of directly conveying a polishing liquid for supply; a method of conveying a stock solution for polishing liquid and a liquid medium through separate piping, joining and mixing these for supply; a method of mixing a stock solution for polishing liquid and a liquid medium in advance for supply; or the like can be used.

In a case in which it is stored as a multi-pack polishing liquid set divided into a slurry and an additive liquid, the polishing rate can be adjusted by arbitrarily changing the composition of these liquids. In a case in which the polishing liquid set is used, examples of a method for supplying the polishing liquid onto a polishing platen include the following method. For example, a method of conveying a slurry and an additive liquid through separate pipings, joining these pipings to mix for supply; a method of conveying a stock solution for slurry, a stock solution for additive liquid, and a liquid medium through separate pipings, joining and mixing these for supply; a method of mixing a slurry and an additive liquid in advance for supply; a method of mixing a stock solution for slurry, a stock solution for additive liquid, and a liquid medium in advance for supply; or the like can be used. Furthermore, a method of supplying a slurry and an additive liquid of the above-described polishing liquid set separately onto the polishing platen can also be used. In this case, a surface to be polished is polished using a polishing liquid that is obtained by mixing the slurry and the additive liquid on the polishing platen.

<Polishing Method>

The polishing method of the present embodiment (such as a polishing method of a base substrate) includes a polishing step of polishing a body to be polished (for example, a base substrate) by using the above-described slurry. The slurry in the polishing step may be a polishing liquid obtained by mixing the slurry and the additive liquid of the above-described polishing liquid set. In the polishing step, the surface to be polished of the body to be polished can be polished. The surface to be polished may contain an insulating material and may contain silicon oxide.

FIG. 1 is a schematic cross-sectional view illustrating a base substrate used in a polishing method of an embodiment. A base substrate 1 includes a substrate 2 and an insulating portion 3. A concave portion is formed on one surface of the substrate 2, and the insulating portion 3 is provided on one surface of the substrate 2 so as to fill the concave portion. In the base substrate 1, the surface of the insulating portion 3 opposite to the substrate 2 is exposed, and this exposed surface is a surface to be polished.

Examples of the substrate 2 include substrates used in production of semiconductor elements (for example, semiconductor substrates on which an STI pattern, a gate pattern, a wiring pattern, or the like are formed). For example, the insulating portion 3 is composed of an insulating material such as an STI insulating material, a pre-metal insulating material, or an interlayer insulating material. Examples of the insulating material include silicon oxide, phosphorus-silicate glass, boron-phosphorus-silicate glass, silicon oxyfluoride, and fluorinated amorphous carbon. The insulating portion 3 may be constituted of a single material or may be constituted of a plurality of materials. The insulating portion 3 may be in the form of a film and may be, for example, a silicon oxide film.

By polishing such an insulating portion 3 formed on the substrate 2 by the above-described slurry to remove an excess region, irregularities on the surface of the insulating portion 3 are eliminated and thus a flat and smooth surface can be obtained over the entire surface of the insulating portion 3. The slurry of the present embodiment is preferably used for polishing a surface of the insulating portion containing silicon oxide (for example, a surface having a region formed from silicon oxide as at least a part thereof).

Examples of a method for producing an insulating portion that is to be polished by the slurry of the present embodiment include CVD methods such as a low-pressure CVD method, a quasi-normal pressure CVD method, or a plasma CVD method; and a spin coating method of applying a liquid raw material on a rotating substrate.

In the polishing step, as a polishing apparatus, a general polishing apparatus, which has a holder that is capable of holding a base substrate having a surface to be polished and a polishing platen to which a polishing pad can be attached, can be used. Specifically, for example, in a state where the surface of the base substrate 1 (the exposed surface of the insulating portion 3) is pressed against the polishing pad (polishing cloth) of the polishing platen, the above-described slurry is supplied between the insulating portion 3 and the polishing pad, and the base substrate 1 and the polishing platen are relatively moved to polish the surface to be polished of the insulating portion 3. In the polishing step, for example, a part of the insulating portion 3 is removed by polishing.

The holder and the polishing platen of the polishing apparatus are respectively equipped with a motor capable of changing a rotation number, or the like. As the polishing apparatus, for example, polishing apparatus: F-REX300 manufactured by EBARA CORPORATION, or polishing apparatus: Reflexion manufactured by Applied Materials, Inc. can be used.

As the polishing pad, a general nonwoven fabric, a foamed body, a non-foamed body, or the like can be used. As the material for the polishing pad, resins such as a polyurethane, an acrylic resin, a polyester, an acryl-ester copolymer, polytetrafluoroethylene, polypropylene, polyethylene, poly-4-methylpentene, cellulose, a cellulose ester, a polyamide (for example, NYLON (trade name) and aramid), a polyimide, a polyimideamide, a polysiloxane copolymer, an oxirane compound, a phenolic resin, polystyrene, a polycarbonate, or an epoxy resin can be used. Particularly, from the viewpoint of obtaining further excellent polishing rate and flattening properties, the material for the polishing pad is preferably at least one selected from the group consisting of a foamed polyurethane and a non-foamed polyurethane. It is preferable that the polishing pad is subjected to groove processing, by which the slurry accumulates thereon.

There are no limitations on the polishing conditions; however, the rotation speed of the polishing platen is preferably 200 min$^{-1}$ (min$^{-1}$=rpm) or less so that the base substrate does not fly away, and the polishing pressure (processing load) applied to the base substrate is preferably 100 kPa or less from the viewpoint of sufficiently suppressing the occurrence of polishing scratching. Also, in the polishing step, during polishing, it is preferable to supply the slurry continuously to the polishing pad using a pump or the like. There are no limitations on the supply amount for this, however, it is preferable that the surface of the polishing pad is always covered with the slurry.

It is preferable that the base substrate after the completion of polishing is thoroughly washed under flowing water, and thereby particles adhering to the base substrate are removed. For the washing, in addition to pure water, dilute hydrofluoric acid or aqueous ammonia may be used in combination therewith, and a brush may be used in combination in order to increase the washing efficiency. Furthermore, after washing, it is preferable that water droplets adhering to the base substrate are dropped by using a spin dryer or the like, and then the base substrate is dried.

As described above, the slurry and the polishing method of the present embodiment can be used in the flattening step of the base substrate surface that is the manufacturing technology of semiconductor elements, and particularly, it can be suitably used in the flattening step of the insulating portion composed of an STI insulating material, a pre-metal insulating material, or an interlayer insulating material. In other words, according to the slurry of the present embodiment, the formation of STI and high-speed polishing of a pre-metal insulating film and an interlayer insulating film are possible.

Also, the slurry and the polishing method of the present embodiment can also be applied to high-dielectric constant materials such as Hf-based, Ti-based, or Ta-based oxides; semiconductor materials such as silicon, amorphous silicon, SiC, SiGe, Ge, GaN, GaP, GaAs, or organic semiconductors; phase change materials such as GeSbTe; inorganic conductive materials such as ITO; and polymer resin materials such as polyimide-based, polybenzoxazole-based, acrylic, epoxy-based, or phenolic resin materials.

Also, the slurry and the polishing method of the present embodiment can be applied not only to film-like objects to be polished, but also various substrates constituted by glass, silicon, SiC, SiGe, Ge, GaN, GaP, GaAs, sapphire, plastics, or the like.

Also, the slurry and the polishing method of the present embodiment can be used not only for the production of semiconductor elements, but also for the production of image display devices such as TFT or organic EL; optical components such as a photomask, a lens, a prism, an optical fiber, or a single crystal scintillator; optical elements such as an optical switching element or an optical waveguide; light-emitting elements such as a solid laser or a blue laser LED; and magnetic storage devices such as a magnetic disc or a magnetic head.

EXAMPLES

Hereinafter, the present invention will be specifically described based on Examples; however, the present invention is not limited to these.

Example 1

(Preparation of Cerium Oxide Slurry)
[Preparation of Cerium Oxide Slurry]
Particles containing cerium oxide (first particles; hereinafter, referred to as "cerium oxide particles") and an aqueous solution of ammonium dihydrogen phosphate manufactured by Wako Pure Chemical Industries, Ltd. were mixed to prepare a cerium oxide slurry (pH: 5.0) containing 5.0% by mass (solid content) of cerium oxide particles. The blending amount of the ammonium dihydrogen phosphate was adjusted so that the content of the ammonium dihydrogen phosphate in a CMP polishing liquid described later became the content shown in Table 1.

[Measurement of Average Particle Size]
An adequate amount of the cerium oxide slurry was introduced into trade name: MICROTRAC MT3300EXII manufactured by MicrotracBEL Corp., and measurement of the average particle size (average secondary particle size) of the cerium oxide particles was performed. The displayed average particle size value was obtained as the average particle size (average secondary particle size). The average particle size in the cerium oxide slurry was 350 nm.

[Measurement of Zeta Potential]
An adequate amount of the cerium oxide slurry was introduced into trade name: DelsaNano C manufactured by Beckman Coulter, Inc., and measurement was performed twice at 25° C. The average value of the displayed zeta potential was obtained as the zeta potential. The zeta potential of the cerium oxide particles in the cerium oxide slurry was −55 mV.

(Preparation of Cerium Hydroxide Slurry)
[Synthesis of Cerium Hydroxide]
350 g of a 50 mass % aqueous solution of $Ce(NH_4)_2(NO_3)_6$ (manufactured by NIHON KAGAKU SANGYO CO., LTD., trade name: CAN50 liquid) was mixed with 7825 g of pure water, and thereby a solution was obtained. Next, while this solution was stirred, 750 g of an aqueous solution of imidazole (10 mass % aqueous solution, 1.47 mol/L) was added dropwise thereto at a mixing rate of 5 mL/min, and thereby a precipitate containing cerium hydroxide was obtained. The synthesis of cerium hydroxide was performed at a temperature of 25° C. at a stirring speed of 400 $min^{-1}$. Stirring was performed using a three-blade pitch paddle having a total blade length of 5 cm.

[Preparation of Cerium Oxide Slurry]
The obtained precipitate (precipitate containing cerium hydroxide) was centrifuged (4000 $min^{-1}$, for 5 minutes), subsequently the liquid phase was removed by decantation to perform solid-liquid separation. 10 g of the particles obtained by solid-liquid separation were mixed with 990 g of water, and then the particles were dispersed in water using an ultrasonic cleaner, thereby a cerium hydroxide slurry (particle content: 1.0 mass %) containing particles that contained cerium hydroxide (second particles; hereinafter, referred to as "cerium hydroxide particles") was prepared.

[Measurement of Average Particle Size]
The average particle size (average secondary particle size) of the cerium hydroxide particles in the cerium hydroxide slurry was measured using trade name: N5 manufactured by Beckman Coulter, Inc., and the average particle size was 25 nm. The measurement method is as follows. First, about 1 mL of a measurement sample (cerium hydroxide slurry, aqueous dispersion liquid) containing 1.0 mass % of cerium hydroxide particles was introduced into a 1-cm square cell, and the cell was placed in N5. As the measurement sample information of the N5 software, the refractive index was set to 1.333 and the viscosity was set to 0.887 mPa·s, and measurement was performed at 25° C., and then, the value displayed as Unimodal Size Mean was read out.

[Measurement of Zeta Potential]
An adequate amount of a cerium hydroxide slurry was introduced into trade name: DelsaNano C manufactured by Beckman Coulter, Inc., and measurement was performed twice at 25° C. The average value of the displayed zeta potentials was obtained as the zeta potential. The zeta potential of the cerium hydroxide particles in the cerium hydroxide slurry was +50 mV.

[Structural Analysis of Cerium Hydroxide Particles]
An adequate amount of a cerium hydroxide slurry was collected and dried in a vacuum, and thereby cerium hydroxide particles were isolated, and then, sufficient washing was performed with pure water to obtain a sample. For the sample thus obtained, measurement was performed according to an FT-IR ATR method, and a peak based on nitrate ion ($NO_3^-$) was observed in addition to a peak based on hydroxide ion ($OH^-$). Furthermore, for the same sample, XPS (N-XPS) measurement for nitrogen was performed, and a peak based on $NH_4^+$ was not observed, while a peak based on nitrate ion was observed. From these results, it was confirmed that cerium hydroxide particles contained, at least in a portion, particles having nitrate ion bonded to cerium element. Furthermore, since particles having hydroxide ion bonded to cerium element were contained at least in a portion of the cerium hydroxide particles, it was confirmed that cerium hydroxide particles contained cerium hydroxide. From these results, it was confirmed that hydroxide of cerium contained hydroxide ion bonded to cerium element.

[Measurement of Absorbance and Light Transmittance]

An adequate amount of a cerium hydroxide slurry was collected and diluted with water such that the content of particles became 0.0065% by mass (65 ppm), and thus, a measurement sample (aqueous dispersion liquid) was obtained. About 4 mL of this measurement sample was introduced into a 1-cm square cell, and the cell was placed in a spectrophotometer (apparatus name: U3310) manufactured by Hitachi, Ltd. Measurement of the absorbance in a wavelength range of 200 to 600 nm was performed, and the absorbance for light having a wavelength of 290 nm and the absorbance for a light having a wavelength of 450 to 600 nm were measured. The absorbance for light having a wavelength of 290 nm was 1.192, and the absorbance for light having a wavelength of 450 to 600 nm was less than 0.010.

About 4 mL of a cerium hydroxide slurry (content of particles: 1.0% by mass) was introduced into a 1-cm square cell, and the cell was placed in a spectrophotometer (apparatus name: U3310) manufactured by Hitachi, Ltd. Measurement of the absorbance in a wavelength range of 200 to 600 nm was performed, and the absorbance for light having a wavelength of 400 nm and the light transmittance for light having a wavelength of 500 nm were measured. The absorbance for light having a wavelength of 400 nm was 2.25, and the light transmittance for light having a wavelength of 500 nm was 92%/cm.

(Preparation of CMP Polishing Liquid)

While stirring at a rotation speed of 300 rpm using a stirring blade of two blades, 100 g of the cerium oxide slurry, 100 g of the cerium hydroxide slurry, 5.5 g of PGL #750 (trade name, polyglycerol (water-soluble polymer), weight average molecular weight: 750) manufactured by Sakamoto Yakuhin Kogyo Co., Ltd., and 794.5 g of ion-exchange water were mixed for 30 minutes to prepare a CMP polishing liquid (content of cerium oxide particles: 0.5% by mass, content of cerium hydroxide particles: 0.1% by mass, content of PGL #750: 0.5% by mass, content of ammonium dihydrogen phosphate: 0.005% by mass, all on the basis of the total mass of the polishing liquid). The respective components were mixed under stirring while being irradiated with ultrasonic waves using an ultrasonic cleaner (device name: US-105) manufactured by SND Co., Ltd. to prepare a CMP polishing liquid. The pH of the polishing liquid was 4.0. Incidentally, the pH was measured using Model No. PHL-40 manufactured by DKK-TOA CORPORATION. It was confirmed that, using a scanning electron microscope S-4800 manufactured by Hitachi High-Technologies Corporation, the cerium oxide particles (first particles) and the cerium hydroxide particles (second particles) were brought into contact with each other to form composite particles.

Examples 2 and 3

CMP polishing liquids were prepared in the same manner as in Example 1, except that the blending amounts of the respective components were changed so that the content of ammonium dihydrogen phosphate became a value shown in Table 1.

Examples 4 and 5 and Comparative Examples 1 to 5>

CMP polishing liquids were prepared in the same manner as in Example 1, except that diammonium hydrogen phosphate (manufactured by Wako Pure Chemical Industries, Ltd.), 1-hydroxyethane-1,1-bis(phosphonic acid) ammonium (prepared by adding a 25% aqueous ammonia manufactured by Wako Pure Chemical Industries, Ltd. to 1-hydroxyethane-1,1-bis(phosphonic acid) manufactured by Wako Pure Chemical Industries, Ltd.), phosphoric acid (manufactured by Wako Pure Chemical Industries, Ltd.), 1-hydroxyethane-1,1-bis(phosphonic acid) (manufactured by Wako Pure Chemical Industries, Ltd., trade name: 60% 1-hydroxyethane-1,1-bis(phosphonic acid) solution), polyacrylic acid (manufactured by Wako Pure Chemical Industries, Ltd., trade name: Polyacrylic acid 5000 (weight average molecular weight: 5000)), acetic acid (manufactured by Wako Pure Chemical Industries, Ltd.), or nitric acid (manufactured by Wako Pure Chemical Industries, Ltd.) was used instead of ammonium dihydrogen phosphate (see Table 1 or 2), and the blending amounts of the respective components were adjusted so that the contents of the respective components in the polishing liquid became values shown in Table 1 or 2.

<Average Particle Size of Abrasive Grains>

Each of the CMP polishing liquids was introduced in an adequate amount into trade name: MICROTRAC MT3300EXII manufactured by MicrotracBEL Corp., and measurement of the average particle size of the abrasive grains was performed. The displayed average particle size value was obtained as the average particle size (average secondary particle size). The average particle sizes of Examples 1 to 5 and Comparative Examples 1 to 5 were 350 nm.

<CMP Evaluation>

The substrate to be polished was polished by using the above-described CMP polishing liquid under the polishing conditions below. Each CMP polishing liquid was a polishing liquid which contains 0.5% by mass of cerium oxide particles (first particles), 0.1% by mass of cerium hydroxide particles (second particles), 0.5% by mass of PGL #750, and an additive shown in Table 1 or 2 (the remaining is ion-exchange water), on the basis of the total mass of the polishing liquid. The pH of each CMP polishing liquid was 4.0.

[CMP polishing Conditions]

Polishing apparatus: Reflexion LK (manufactured by Applied Materials, Inc.)

Flow rate of CMP polishing liquid: 250 mL/min

Substrate to be polished: As a blanket wafer having no pattern formed thereon, a substrate to be polished having a silicon oxide ($SiO_2$, p-TEOS) film having a thickness of 2 μm, which had been formed by a plasma CVD method, on a silicon substrate was used.

Polishing pad: Foamed polyurethane resin having closed pores (manufactured by Rohm and Haas Japan K.K., Product No.: IC1010)

Polishing pressure: 21 kPa (3.0 psi)

Rotation numbers of substrate to be polished and polishing platen: Substrate to be polished/polishing platen=93/87 rpm Polishing time: 0.5 minutes (30 seconds)

Washing of wafer: After a CMP treatment, washing was performed with water while applying an ultrasonic wave, and then drying was performed with a spin dryer.

The polishing rate (RR: Removal Rate) of a silicon oxide film that had been polished and washed under the above-described conditions was obtained by the formula below. Incidentally, the film thickness difference of the silicon oxide film before and after polishing was obtained using a light interference type film thickness measuring apparatus (manufactured by Filmetrics Japan, Inc., trade name: F80). The measurement results are shown in Tables 1 and 2.

Polishing rate (RR)=(Film thickness difference [nm] of silicon oxide film before and after polishing)/ (polishing time: 0.5 [min])

<Storage Stability Evaluation>

The increase rate of the D99 particle size was calculated and the storage stability was evaluated. Specifically, the D99 particle sizes of the polishing liquid immediately after preparation and the polishing liquid left to stand still in the thermostatic bath set at 60° C. for 5 days after preparation were measured using trade name: MICROTRAC MT3300EXII manufactured by MicrotracBEL Corp., and the D99 particle size increase rate was obtained according to the equation below. The measurement results are shown in Tables 1 and 2.

D99 particle size increase rate (%)=[(D99 particle size of the polishing liquid stored in the thermostatic bath set at 60° C. for 5 days)/(D99 particle size of the polishing liquid immediately after preparation)−1]×100

REFERENCE SIGNS LIST

1: base substrate (body to be polished), 2: substrate, 3: insulating portion.

The invention claimed is:

1. A slurry comprising:
abrasive grains;
a liquid medium; and
a salt of a compound represented by formula (1) below

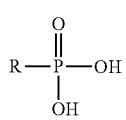

(1)

in formula (1), R represents a hydroxyl group or a monovalent organic group, wherein
the abrasive grains include first particles and second particles in contact with the first particles,
the first particles contain cerium oxide,
the second particles contain a hydroxide of a tetravalent metal element,
the average particle size of the second particles is smaller than the average particle size of the first particles,

TABLE 1

| Item | | | Example 1 | Example 2 | Example 3 | Example 4 | Example 5 |
|---|---|---|---|---|---|---|---|
| Polishing liquid composition | Additive | Type | Ammonium dihydrogen phosphate | | | Diammonium hydrogen phosphate | 1-Hydroxyethane-1,1-bis(phosphonic acid) ammonium |
| | | Blending amount (% by mass) | 0.005 | 0.01 | 0.02 | 0.01 | 0.01 |
| Polishing liquid characteristics | Polishing rate (nm/min) | | 850 | 880 | 680 | 800 | 770 |
| | Storage stability at 60° C. for 5 days (D99 particle size increase rate) (%) | | <1.0 | <1.0 | <1.0 | <1.0 | 7 |

TABLE 2

| Item | | | Comparative Example 1 | Comparative Example 2 | Comparative Example 3 | Comparative Example 4 | Comparative Example 5 |
|---|---|---|---|---|---|---|---|
| Polishing liquid composition | Additive | Type | Phosphoric acid | 1-Hydroxyethane-1,1-bis(phosphonic acid) | Polyacrylic acid | Acetic acid | Nitric acid |
| | | Blending amount (% by mass) | 0.01 | 0.01 | 0.01 | 0.01 | 0.01 |
| Polishing liquid characteristics | Polishing rate (nm/min) | | 200 | 310 | 800 | 820 | 710 |
| | Storage stability at 60° C. for 5 days (D99 particle size increase rate) (%) | | >50 (aggregation) | >50 (aggregation) | >50 (aggregation) | 15 | 18 | the average secondary particle size of the abrasive grains is more than 100 nm, the salt of the compound represented by formula (1) contains at least one selected from the group consisting of a compound represented by formula (2) below and a compound represented by formula (3) below

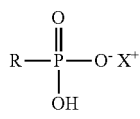
(2)

in formula (2), R represents a hydroxyl group or a monovalent organic group, and $X^+$ represents an ammonium ion,

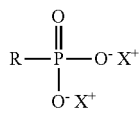
(3)

in formula (3), R represents a hydroxyl group or a monovalent organic group, and $X^+$ represents an ammonium ion, and pH of the slurry is 7.0 or lower.

2. The slurry according to claim 1, wherein the hydroxide of a tetravalent metal element contains at least one selected from the group consisting of hydroxides of rare earth metal elements and hydroxide of zirconium.

3. The slurry according to claim 1, wherein a content of the abrasive grains is 0.01 to 10% by mass on the basis of the total mass of the slurry.

4. The slurry according to claim 1, wherein R is a hydroxyl group in formula (2) and formula (3).

5. The slurry according to claim 1, wherein a content of the salt of the compound represented by formula (1) is 0.001 to 0.1% by mass on the basis of the total mass of the slurry.

6. The slurry according to claim 1, wherein the slurry is used for polishing a body to be polished containing silicon oxide.

7. A polishing method comprising a step of polishing a body to be polished by using the slurry according to claim 1.

8. The polishing method according to claim 7, wherein the body to be polished contains silicon oxide.

9. The slurry according to claim 1, wherein pH of the slurry is 6.5 or lower.

10. The slurry according to claim 1, wherein a content of the salt of the compound represented by formula (1) is 0.03% by mass or less on the basis of the total mass of the slurry.

11. The slurry according to claim 1, wherein the particle size of the second particles is 1 nm or more and 25 nm or less.

12. The slurry according to claim 1, wherein the salt of the compound represented by formula (1) comprises one or more of ammonium dihydrogen phosphate and diammonium hydrogen phosphate.

13. The slurry according to claim 1, wherein the average secondary particle size of the abrasive grains is more than 100 nm and 1000 nm or less.

14. A slurry comprising:
abrasive grains;
a liquid medium; and
a salt of a compound represented by formula (1) below

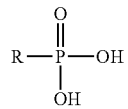
(1)

in formula (1), R represents a hydroxyl group or a monovalent organic group, wherein the abrasive grains include first particles and second particles in contact with the first particles, the first particles contain cerium oxide, the second particles contain a hydroxide of a tetravalent metal element, the average particle size of the second particles is smaller than the average particle size of the first particles, the average secondary particle size of the abrasive grains is more than 100 nm and 1000 nm or less, the salt of the compound represented by formula (1) contains an ammonium salt, a content of the salt of the compound represented by formula (1) is 0.03% by mass or less on the basis of the total mass of the slurry, and pH of the slurry is 7.0 or lower.

15. A slurry comprising:
abrasive grains;
a liquid medium; and
a salt of a compound represented by formula (1) below

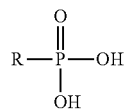
(1)

in formula (1), R represents a hydroxyl group or a monovalent organic group, wherein the abrasive grains include first particles and second particles in contact with the first particles, the first particles contain cerium oxide, the second particles contain a hydroxide of a tetravalent metal element, the average particle size of the second particles is smaller than the average particle size of the first particles, the average secondary particle size of the abrasive grains is more than 100 nm, and the salt of the compound represented by formula (1) contains an ammonium salt of a compound represented by represented by formula (1a) below,

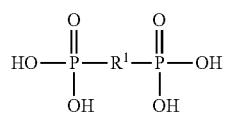
(1a)

in formula (1a), $R^1$ represents a divalent organic group.

16. The slurry according to claim 15, wherein pH of the slurry is 7.0 or lower.

17. The slurry according to claim 1, wherein the content of the abrasive grains is less than 1% by mass on the basis of the total mass of the slurry.

18. The slurry according to claim 14, wherein pH of the slurry is 6.5 or lower.

\* \* \* \* \*